United States Patent
Eliav et al.

(10) Patent No.: US 7,795,867 B2
(45) Date of Patent: Sep. 14, 2010

(54) METHOD, APPARATUS AND SYSTEM FOR MAGNETIC RESONANCE ANALYSIS BASED ON WATER MAGNETIZATION TRANSFERRED FROM OTHER MOLECULES

(75) Inventors: Uzi Eliav, Tel-Aviv (IL); Gil Navon, Ramat-Gan (IL); Arnon Neufeld, Tel-Aviv (IL)

(73) Assignee: Ramot at Tel-Aviv University Ltd., Tel-Aviv (IL)

( * ) Notice: Subject to any disclaimer, the term of this patent is extended or adjusted under 35 U.S.C. 154(b) by 155 days.

(21) Appl. No.: 12/223,397

(22) PCT Filed: Feb. 4, 2007

(86) PCT No.: PCT/IL2007/000139

§ 371 (c)(1),
(2), (4) Date: Jul. 30, 2008

(87) PCT Pub. No.: WO2007/088548

PCT Pub. Date: Aug. 9, 2007

(65) Prior Publication Data

US 2009/0167303 A1 Jul. 2, 2009

Related U.S. Application Data

(60) Provisional application No. 60/764,369, filed on Feb. 2, 2006.

(51) Int. Cl.
*G01V 3/00* (2006.01)
(52) U.S. Cl. .................. 324/307; 324/309
(58) Field of Classification Search .......... 324/300–322
See application file for complete search history.

(56) References Cited

U.S. PATENT DOCUMENTS

| | | | | |
|---|---|---|---|---|
| 4,678,995 A | * | 7/1987 | Avison et al. | 324/309 |
| 4,703,270 A | * | 10/1987 | Hall et al. | 324/309 |
| 4,962,357 A | * | 10/1990 | Sotak | 324/309 |
| 5,125,407 A | | 6/1992 | Harms et al. | |
| 5,166,616 A | * | 11/1992 | Doddrell et al. | 324/307 |
| 5,202,631 A | | 4/1993 | Harms et al. | |
| 5,270,652 A | | 12/1993 | Dixon et al. | |
| 5,751,145 A | * | 5/1998 | Shimizu | 324/309 |
| 7,141,432 B2 | * | 11/2006 | Szyperski | 436/173 |
| 7,396,685 B2 | * | 7/2008 | Szyperski et al. | 436/173 |
| 7,609,060 B2 | * | 10/2009 | Hetherington et al. | 324/307 |

OTHER PUBLICATIONS

International Preliminary Report on Patentability Dated Aug. 14, 2008 From the International Bureau of WIPO Re.: Application No. PCT/IL2007/000139.

(Continued)

*Primary Examiner*—Brij B Shrivastav
*Assistant Examiner*—Dixomara Vargas

(57) ABSTRACT

A method of magnetic resonance analysis of a body having therein at least one molecular species and water is disclosed. The method comprises, subtracting magnetic resonance signals induced by a second radiofrequency pulse sequence from magnetic resonance signals induced by a first radiofrequency pulse sequence followed by a evolution period. The first radiofrequency pulse sequence is selected so as to suppress magnetization for the water while preserving a generally longitudinal magnetization to the at least one molecular species. The second radiofrequency pulse sequence being selected so as to suppress transverse and longitudinal magnetization for both the water and the at least one molecular species.

28 Claims, 6 Drawing Sheets

OTHER PUBLICATIONS

Carasso et al. "Nuclear Magnetic Resonance Parameters for Monitoring Coagulation of Liver Tissue", Magnetic Resonance in Medicine, 54: 1082-1086, 2005.

International Search Report and the Written Opinion Dated Oct. 3, 2007 and Reissued on Nov. 15, 2007 From the International Searching Authority Re.: Application No. PCT/IL07/00139.

* cited by examiner

METHOD, APPARATUS AND SYSTEM FOR MAGNETIC RESONANCE ANALYSIS BASED ON WATER MAGNETIZATION TRANSFERRED FROM OTHER MOLECULES

RELATED APPLICATIONS

This Application is a National Phase of PCT Patent Application No. PCT/IL2007/000139 having International filing date of Feb. 4, 2007, which claims the benefit of U.S. Provisional Patent Application No. 60/764,369 filed on Feb. 2, 2006. The contents of the above Applications are all incorporated herein by reference.

FIELD AND BACKGROUND OF THE INVENTION

The present invention relates to magnetic resonance and, more particularly, to a method, system and radiofrequency pulse sequence for magnetic resonance analysis and/or imaging of a body having therein water molecules and one or more molecular species capable of magnetically interacting with the water molecules.

Magnetic resonance imaging (MRI) is a method to obtain an image representing the chemical and physical microscopic properties of materials, by utilizing a quantum mechanical phenomenon, named Nuclear Magnetic Resonance (NMR), in which a system of spins, placed in a magnetic field resonantly absorb energy, when applied with a certain frequency.

A nucleus can experience NMR only if its nuclear spin I does not vanish, i.e., the nucleus has at least one unpaired nucleon. Examples of non-zero spin nuclei frequently used in MRI include $^1$H (I=1/2), $^2$H (I=1), $^{23}$Na (I=3/2), etc. When placed in a magnetic field, a nucleus having a spin I is allowed to be in a discrete set of energy levels, the number of which is determined by I, and the separation of which is determined by the gyromagnetic ratio of the nucleus and by the magnetic field. Under the influence of a small perturbation, manifested as a radiofrequency magnetic field, which rotates about the direction of a primary static magnetic field, the nucleus has a time dependent probability to experience a transition from one energy level to another. With a specific frequency of the rotating magnetic field, the transition probability may reach the value of unity. Hence at certain times, a transition is forced on the nucleus, even though the rotating magnetic field may be of small magnitude relative to the static magnetic field. For an ensemble of spin I nuclei the transitions are realized through a change in the overall magnetization.

Once a change in the magnetization occurs, a system of spins tends to restore its magnetization longitudinal equilibrium value, by the thermodynamic principle of minimal energy. The time constant which control the elapsed time for the system to return to the equilibrium value is called "spin-lattice relaxation time" or "longitudinal relaxation time" and is commonly denoted $T_1$. An additional time constant, $T_2$ ($\leq T_1$), called "spin-spin relaxation time" or "transverse relaxation time", controls the elapsed time in which the transverse magnetization diminishes, by the principle of maximal entropy. However, inter-molecule interactions and local variations in the value of the static magnetic field alter the value of $T_2$, to an actual value commonly denoted $T_2^*$.

In MRI, a static magnetic field having a predetermined gradient is applied on an object, thereby creating, at each region of the object, a unique magnetic field. By detecting the NMR signal, knowing the magnetic field gradient, the position of each region of the object can be imaged.

In MRI, pulse sequences are applied to the object (e.g., a human or animal) to generate NMR signals and obtain information therefrom which is subsequently used to reconstruct images of the object. The produced image is affected by parameters such as spin density, transverse and longitudinal relaxation times, residual dipolar interactions in anisotropic media (such as fibrous biological tissues), chemical exchange between proteins, membranes and water. The aforementioned relaxation times and the density distribution of the nuclear spin are properties which vary from one normal tissue to the other and from one diseased tissue to the other. These quantities are therefore responsible for contrast between tissues in various imaging techniques, hence permitting image segmentation.

A common characteristic for many MRI techniques is that the properties of water molecules are measured, which properties are indirectly dependent on interaction with macromolecules such as proteins.

Over the years, many MRI method have been developed to meet the requirements of contrast enhancement. Representative examples of such methods include $T_1$ weighted MRI, $T_2$ weighted MRI, fat suppression MRI and diffusion weighted MRI.

Of particular relevance to the present invention are methods in which the contrast between tissues is increased by non-invasive physical means. One such method is known as the Magnetization Transfer Contrast (MTC) method [S. D. Wolff and R. S. Balaban, Magn. Reson. Med., 10, 135 (1989)]. For this technique to be effective, there must be at least two spin systems in the imaged anatomy which are capable of exchanging energy between themselves and should be distinguished from one another by a certain magnetic resonance parameter. One such distinguishing parameter is the transverse relaxation time. A typical example for such two spin systems is protein, with a short $T_2$, and water with a long $T_2$.

Due to the inverse relationship between $T_2$ and the NMR spectral linewidth, a broad peak would be observed from the protein and a narrow peak would be observed from the water, had the two systems been measured separately. However, when these systems are imaged, the acquisition of the signal from the protein is practically impossible because for most clinical systems this signal decays off prior or very shortly after such acquisition starts. According to the MTC method, the above difficulty is resolved, by applying an appropriate pulse sequence that saturates the protein spin system and not the water. Consequently, the exchange of magnetization between water molecules and macromolecules can be detected. Hence, saturating the protein ensures contrast between water being in contact with the protein and water being far from the protein.

Although MTC is a method which is dependent on the nature of the proteins, it has two major drawbacks. First, in MTC signals indicating magnetization transfer from the protein to the water are entangled with signals indicating direct excitation of the water molecules. Secondly, the MTC is not directly related to the amount and properties of the other species.

Also known, is a method known as Double Quantum Filter Magnetization Transfer (DQF-MT) useful for semi-rigid tissues, such as articular cartilage and tendons [International Patent Application No. WO02/052283; A. Neufeld, U. Eliav and G. Navon, "New MRI method with contrast based on the macromolecular characteristics of tissues," Magn. Reson. Med. 50, 229, 2003]. This method is based on the residual intramolecular dipolar interaction in macromolecules and water molecules. Using a double quantum filtered (DQF)

sequence, macromolecules are selectively excited. Subsequently, the magnetization is transferred to the water, allowing imaging of the water magnetization originating from the macromolecules and thus giving an image relating to the macromolecular content. The contrast in DQF MRI stems from the fact that only water molecules associated with ordered structures are detected while signals originating from molecules in isotropic tissues are suppressed.

An additional method for increasing contrast is based on the subtraction of two signals [M. Goldman and L. Shen, Spin-Spin Relaxation in Laf3, Phys. Rev. 144, 321, 1966; J. P. Renou, J. Alizon, M. Dohri, H. Robert, J. Biochem. and Biophys. Meth., 7, 91, 1983; D. Carasso, U. Eliav and G. Navon, "NMR parameters for monitoring coagulation of liver tissue," Magn. Reson. Med. 54, 1082, 2005; U.S. Patent Application No. 60/607,589]. The signal of water obtained with one pulse sequence is subtracted from the water signal obtained with another pulse sequence. The two pulse sequences are selected such that in one pulse sequence, the magnetization transfer takes place, while in the other pulse sequence includes time-intervals which are too short for magnetization transfer.

A major disadvantage of the techniques disclosed in Neufeld et al. and Carasso et al. supra is that they require very short radiofrequency pulses having homogenous radiofrequency magnetic field. Typically, radiofrequency pulses of less than 100 µs should be generated to achieve the desired effect. However, presently available clinical MRI scanners, particularly whole body scanners in which large radiofrequency coils are deployed, require much longer radiofrequency pulses.

There is thus a widely recognized need for, and it would be highly advantageous to have, a MRI method and system for selective excitation devoid of the above limitations.

SUMMARY OF THE INVENTION

According to one aspect of the present invention there is provided a method of magnetic resonance analysis of a body having therein at least one molecular species and water. The method comprises: subtracting magnetic resonance signals induced by a second radiofrequency pulse sequence from magnetic resonance signals induced by a first radiofrequency pulse sequence followed by a evolution period. The first radiofrequency pulse sequence is selected so as to suppress magnetization for the water while preserving a generally longitudinal magnetization to the at least one molecular species, and the second radiofrequency pulse sequence being selected so as to suppress transverse and longitudinal magnetization for both the water and the at least one molecular species.

According to another aspect of the present invention there is provided a magnetic resonance imaging system for imaging a body having therein at least one molecular species and water. The system comprises a control system configured for: implementing a the radiofrequency pulse sequence followed by a evolution period, acquiring magnetic resonance signals from the body to obtain a first magnetic resonance acquisition, implementing the second radiofrequency pulse sequence, acquiring magnetic resonance signals from the body to obtain a second magnetic resonance acquisition, and subtracting signals of the second magnetic resonance acquisition from signals of the first magnetic resonance acquisition.

According to further features in preferred embodiments of the invention described below, the first radiofrequency pulse sequence is selected so as to momentarily produce a generally transv+erse magnetization for the water, and to dephase the generally transverse magnetization thereafter.

According to still further features in the described preferred embodiments the second radiofrequency pulse sequence is selected so as to momentarily produce a generally transverse magnetization for the water and a generally transverse magnetization for the at least one molecular species, and to dephase the generally transverse magnetizations thereafter.

According to still further features in the described preferred embodiments each of the first and the second radiofrequency pulse sequence independently comprises at least one crusher pulse.

According to still further features in the described preferred embodiments each of the first and the second radiofrequency pulse sequences independently comprises at least one pulse being characterized by a pulse length of at least 100 microseconds.

According to still further features in the described preferred embodiments each of the first and the second radiofrequency pulse sequence independently comprises at least one 90-degrees pulse.

According to still further features in the described preferred embodiments the pulse length of the at least pulse of the first radiofrequency pulse sequence is longer than the pulse length of the at least one pulse of the second radiofrequency pulse sequence.

According to still further features in the described preferred embodiments the intensity of the at least one pulse of the first radiofrequency pulse sequence is lower than the intensity of the at least one pulse of the second radiofrequency pulse sequence.

According to yet another aspect of the present invention there is provided a method of magnetic resonance analysis of a body. The method comprises applying a radiofrequency pulse sequence which comprises at least one pulse characterized by a pulse length of at least 250 microseconds, so as to suppress magnetization for the water while preserving a generally longitudinal magnetization to the at least one molecular species; during a predetermined evolution period, allowing magnetization transfer from the at least one molecular species and the water; and acquiring magnetic resonance signals from the body, thereby analyzing the at least one molecular species.

According to still another aspect of the present invention there is provided an apparatus for producing a radiofrequency pulse sequence for magnetic resonance analysis. The apparatus comprises a pulse generator configured for generating a radiofrequency pulse sequence which comprises at least one pulse characterized by a pulse length of at least 250 microseconds as described herein.

According to an additional aspect of the present invention there is provided a magnetic resonance imaging system for analysis a body. The system comprises: a static magnet system for generating a substantially homogeneous and stationary magnetic field in a longitudinal direction; a gradient assembly for instantaneously generating magnetic field gradient pulses to form a non-uniform superimposed magnetic field; a radiofrequency transmitter system for generating and transmitting radiofrequency pulses to the body; an acquisition system for acquiring magnetic resonance signal from the body; and a control system configured to implement a radiofrequency pulse sequence followed by a predetermined evolution period, the radiofrequency pulse sequence being generated by the gradient assembly and/or the radiofrequency transmitter system such that a magnetization for the water is suppressed and a magnetization for the at least one molecular species is preserved in a generally longitudinal orientation.

According to still further features in the described preferred embodiments any of the radiofrequency pulse sequences is characterized by repetition factor selected so as to minimize the magnetization of the water.

According to still further features in the described preferred embodiments the second radiofrequency pulse sequence is characterized by repetition factor selected so as to minimize the magnetizations of the water and the at least one molecular species.

According to still further features in the described preferred embodiments the second radiofrequency pulse sequence comprises a preparation radiofrequency pulse characterized by a pulse length of the order of the characteristic longitudinal relaxation time of the water.

According to still further features in the described preferred embodiments the method further comprises producing at least one magnetic resonance image of the body.

According to still further features in the described preferred embodiments the subtraction comprises producing a first digital magnetic resonance image of the body from the magnetic resonance signals induced by the first radiofrequency pulse sequence, producing a second digital magnetic resonance image of the body from the magnetic resonance signals induced by the second radiofrequency pulse sequence, and digitally subtracting the second image from the first image.

According to still further features in the described preferred embodiments the system further comprises an image producing system for producing at least one magnetic resonance image of the body.

According to still further features in the described preferred embodiments the system further comprises an image producing system, wherein the control system and the image producing system are designed and configured to produce a first digital magnetic resonance image of the body from the first magnetic resonance acquisition and a second digital magnetic resonance image of the body from the second magnetic resonance acquisition, and to digitally subtract the second image from the first image.

According to still further features in the described preferred embodiments the molecular species comprises at least one macromolecule.

According to still further features in the described preferred embodiments the macromolecule is selected from the group consisting of a protein, a glycoprotein, a proteolipid, a lipid, a carbohydrate, a nucleic acid and a complex of macromolecules which comprises at least two components selected from the group consisting of a protein, a glycoprotein, a proteolipid, a lipid, a carbohydrate, a nucleic acid.

According to still further features in the described preferred embodiments the body is a body of a mammal or a part thereof.

According to still further features in the described preferred embodiments the body comprises a tissue.

According to still further features in the described preferred embodiments the tissue is selected from the group consisting of a connective tissue, a tendon, a portion of a skin, a bone, a muscle, a cartilage, a blood vessel, a ligament, a nerve and a lymph node.

According to still further features in the described preferred embodiments the part is an organ selected from the group consisting of a brain, a heart, a kidney, a gland, a testicle, an ovary, an eye, a liver, a pancreas and a spleen.

The present invention successfully addresses the shortcomings of the presently known configurations by providing a method, apparatus and system for magnetic resonance analysis and/or imaging.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In case of conflict, the patent specification, including definitions, will control. In addition, the materials, methods, and examples are illustrative only and not intended to be limiting.

Implementation of the method and system of the present invention involves performing or completing selected tasks or steps manually, automatically, or a combination thereof. Moreover, according to actual instrumentation and equipment of preferred embodiments of the method and system of the present invention, several selected steps could be implemented by hardware or by software on any operating system of any firmware or a combination thereof. For example, as hardware, selected steps of the invention could be implemented as a chip or a circuit. As software, selected steps of the invention could be implemented as a plurality of software instructions being executed by a computer using any suitable operating system. In any case, selected steps of the method and system of the invention could be described as being performed by a data processor, such as a computing platform for executing a plurality of instructions.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings:

FIG. 6b shows magnetization exchange time analysis for two regions of interest encircled on FIG. 6a.

DESCRIPTION OF THE PREFERRED EMBODIMENTS

Figure 1A:
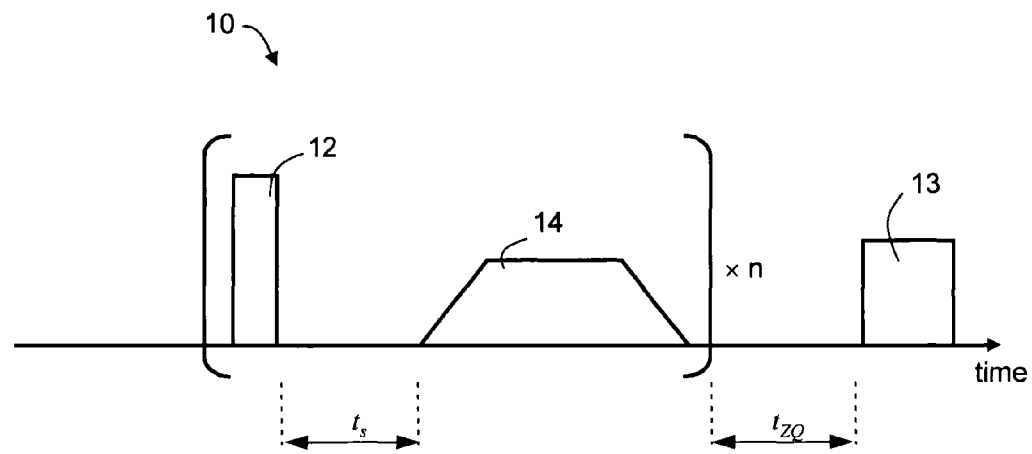
FIGS. 1a-b is a schematic illustration of a pulse sequence which can be used for obtaining magnetization transfer, according to various exemplary embodiments of the present invention.

The present embodiments comprise a method, system and pulse sequence which can be used in magnetic resonance analysis and/or imaging. Specifically, the present embodiments can be used for selective acquisition of magnetic resonance signals from various molecular species present in water and being capable of magnetically interacting therewith.

The principles and operation of a method, system and pulse sequence according to the present invention may be better understood with reference to the drawings and accompanying descriptions.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

The present embodiments are useful for producing magnetic resonance images of a body of a human or an animal. In particular, the present embodiments are useful for improving the contrast of molecular species characterized by high molecular mass, e.g., macromolecules. Representative examples of such molecules include organic and biological molecules, such as, but not limited to, proteins, glycoproteins, proteolipids, lipids, carbohydrates, nucleic acids, and any complex of macromolecules which comprises at least two of the above types of molecules.

Magnetic resonance images can be obtained according to the present embodiments for the whole body of the mammalian subject or for any part (e.g., organ) thereof, including, without limitation, the brain, the heart, a kidney, a gland, a testicle, an ovary, an eye, the liver, the pancreas and the spleen. Such images can provide information regarding the type and/or content of various tissues, such as, but not limited to, tendons, skin portions, bones, muscles, cartilages, blood vessels, ligaments, nerves, lymph nodes and the like.

Also contemplated are embodiment in which the method, system and/or pulse sequence are used for analysis purposes, e.g., spectroscopy and the like. In these embodiments, the body can be a sample of a biological material (e.g., a tissue sample, a plant sample) or a non-biological material, provided the analyzed material has a water component and one or more molecular species of sufficiently high molecular mass (preferably more than 50 kDa). Also contemplated are materials having a water component and rigid structures such as membranes.

Magnetic resonance analysis or imaging of biological materials according to the present embodiments can be performed on live human or animals or ex-vivo.

While the embodiments below are described with a particular emphasis to magnetic resonance imaging, it is to be understood that more detailed reference to imaging is not to be interpreted as limiting the scope of the invention in any way.

Any magnetic resonance method for analyzing or imaging a body includes an application of a radiofrequency pulse sequence to the body, so as to create excitations within the atoms making the body. In an acquisition step, following the pulse sequence, excitations signals from the body are further analyzed by computational methods to provide a spectroscopic analysis or a visual image of the body or part thereof.

Generally, the present embodiments contemplate two types of pulse sequences. A first such type, referred to hereinafter as radiofrequency pulse sequence 10, substantially suppresses the magnetization of the water while preserving a generally longitudinal magnetization of the molecular species. In various exemplary embodiments of the invention pulse sequence 10 momentarily produces a generally transverse magnetization for the water, and dephases the transverse magnetization thereafter. A second type of radiofrequency pulse sequence, referred to hereinafter as pulse sequence 20, substantially suppresses transverse and longitudinal magnetization for both the water and molecular species. Sequence 20 can also be constructed to momentarily produce generally transverse magnetizations for the water and molecular species, and dephases the transverse magnetizations thereafter. The two types of pulse sequences can be applied singly or in combination, as further detailed hereinunder.

Figure 1B:
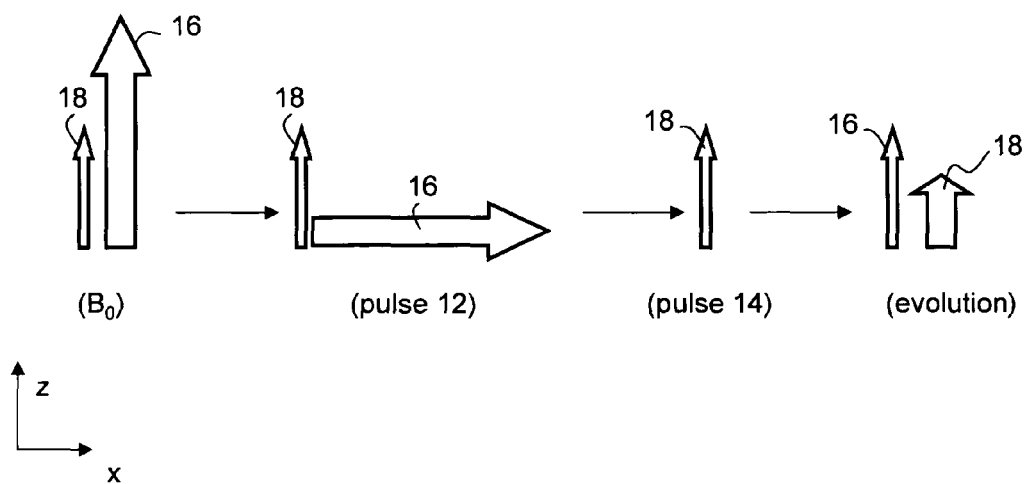

Referring now to the drawings, FIGS. 1a-b illustrate pulse sequence 10, according to various exemplary embodiments of the present invention. Sequence 10 preferably comprises one or more pulses 12 which momentarily produce a generally transverse magnetization for the water, but preserve a generally longitudinal magnetization for the molecular species. In various exemplary embodiments of the invention pulse 12 is a 90° pulse. According to a preferred embodiment of the present invention the length of pulse 12 is at least 100 µs, more preferably at least 200 µs, more preferably at least 250 µs, more preferably at least 300 µs, more preferably at least 350 µs, even more preferably from about 400 µs to about 1 ms, say between 400 µs and 1 ms, inclusive.

As used herein the term "about" refers to ±10%.

Thus, unlike the MTC, DQF and other magnetic resonance methods which employ short pulses (of order of a few tens of microseconds), the present embodiments contemplate the use of long pulses, which may be of the order of a hundred or a few hundreds of microseconds. The advantage of using long pulses is that such pulses can be implemented on clinical MRI scanners, particularly whole body scanners, whereas pulses of less than 100 µs cannot be implemented with such scanners.

According to a preferred embodiment of the present invention sequence 10 also comprise at least one crusher pulse 14 which suppresses the transverse magnetization by dephasing it. Crusher pulse 14 is preferably gradient pulse generated by the gradient coils of the MRI system. Pulse 14 can also be a combination of gradient and radiofrequency pulses.

The effect of pulse sequence 10 on the magnetization vector M is illustrated in FIG. 1b. Shown in FIG. 1b are the magnetization vectors the water molecules and the molecules of the molecular species projected on an x-z plane. The Cartesian x-y-z coordinate system is such that the z direction is parallel to the direction of the static magnetic field $B_0$ applied by the magnetic resonance system. The z direction is referred to herein as the longitudinal direction. The x-y plane (represented by the x axis in FIG. 1b) is referred to as the transverse plane. The magnetizations are illustrated in FIG. 1b as block arrows and are designated by reference numerals 16 (for the magnetization of water) and 18 (for the magnetization of the molecular species). Transitions between states are illustrated in FIG. 1b as single arrows.

As shown in FIG. 1b when the primary static magnetic field $B_0$ is not perturbed by a radiofrequency pulse, both magnetizations 16 and 18 are oriented generally along the longitudinal direction, because the nuclei spins tend to align parallel to the external magnetic field so as to minimize the energy of the system. This state is referred to as equilibrium. The result of pulse 12 is an exclusive tilt of the water magnetization away from the z direction, preferably by 90°. The tilt is "exclusive" in the sense that magnetization vector 18 of the molecular species remains generally along the longitudinal direction.

It is appreciated that the magnetization vector of the materials in question (either water or molecular species) is an averaged quantity over all nuclei spins, and, as such may slightly deviate from precise orientation along the z axis in the lower energy state. Such small deviations (by say, 2° or less) is known to those skilled in the art of magnetic resonance and the use of term "generally longitudinal magnetization" is intended to include all such deviations.

Further, in various exemplary embodiments of the invention the excited energy state of the material in question is characterized by a magnetization vector which lies in the transverse plane. However, this need not necessarily be the case, since, for some applications, there may be a non-zero component of the magnetization vector along the longitudinal direction. The term "generally transverse magnetization" refers to any situation in which the magnetization vector is tilted by a sufficiently large angle (e.g., 80° or more) with respect to the longitudinal direction. In any event, for any material, the transition from the lower energy state to the excited energy state is realized by an inclement of the transverse component of the magnetization vector.

With the application of the crusher pulse (pulse 14 in FIG. 1a), magnetization 16 is suppressed while magnetization 18 remains generally in the longitudinal direction. The suppression of magnetization is preferably by at least 90%, more preferably 95%. In various exemplary embodiments of the invention crusher pulse 14 substantially nulls magnetization 16.

Thus, sequence 10 suppresses the magnetization for the water while preserving a generally longitudinal magnetization for the molecular species.

The period $t_s$ between pulse 12 and pulse 14 is preferably selected sufficiently short relative to the longitudinal relaxation time $T_1$ of the water, so as not to allow the magnetization 16 to realign with magnetization 18 prior to the application of crusher pulse 14. A typical period for $t_s$ is less than 0.2 ms, more preferably less than 20 μs.

In various exemplary embodiments of the invention sequence 10 comprises n repetition of pulses 12 and 14, where n is a positive integer, referred to as a repetition factor. For example, when n=2, sequence 10 comprises four pulses: [12, 14]×2=12, 14, 12, 14. The value of n is preferably selected so as to minimize the magnetization of the water subsequently to the application of the last crusher pulse of sequence 10. Optimization of the repetition factor n can be achieved in more than one way. For example, in one embodiment a series of magnetic resonance images are provided, each image with a different value of n. The images of the series can then be examined to select the image with best contrast. Alternatively, the remnant magnetization of water as a function of n can be constructed by spectroscopic means, and the value of n which minimizes the water signal can be selected.

Whether or not there are repetitions of pulses 12 and 14, there is a predetermined evolution period, $t_{ZQ}$, during which the (longitudinal) magnetization of the molecular species is at least partially transferred to the water molecules, such that a "pseudo-equilibrium" between the water and the molecular species is established. In other words, the magnetization is transferred from the molecular species to the water such that the ratio between the two magnetizations is identical to its value in thermal equilibrium. Since the magnetization of the water prior to the magnetic resonance acquisition is proportional to the magnetization of the molecular species, the obtained magnetization configuration allows the analysis of the molecular species based on magnetic resonance signals acquired from the water. The acquisition time and pulse sequence are generally shown at 13.

Figure 2A:
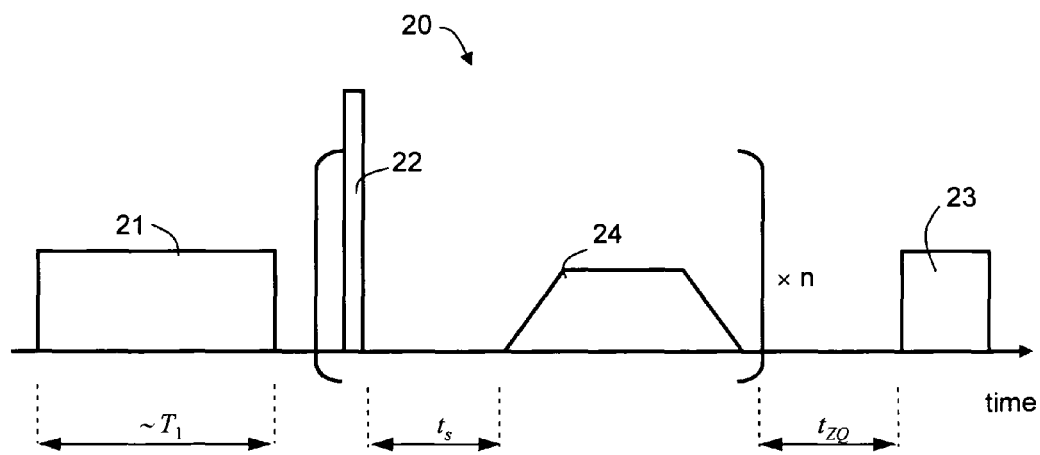
FIGS. 2a-b is a schematic illustration of a pulse sequence which can be used for obtaining longitudinal relaxation substantially without detection of magnetization transfer, according to various exemplary embodiments of the present invention.
Figure 2B:
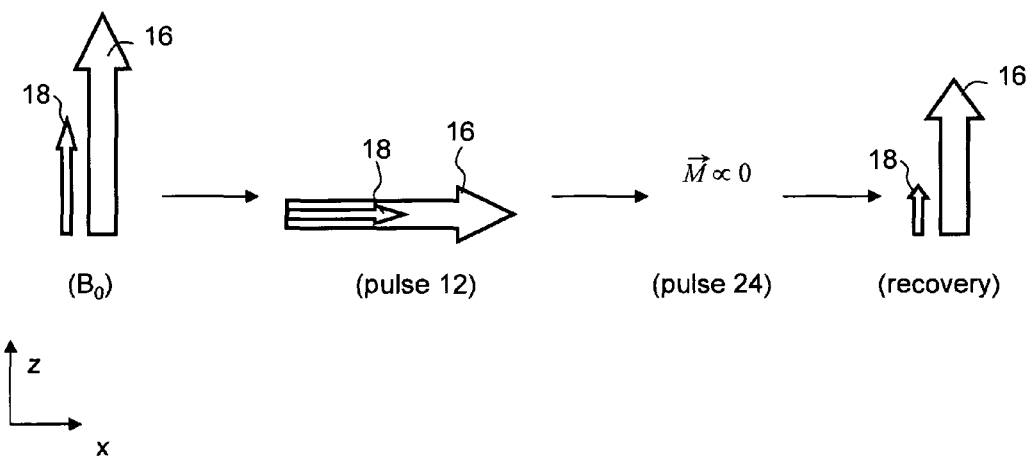

Reference is now made to FIGS. 2a-b which schematically illustrate pulse sequence 20, according to various exemplary embodiments of the present invention. Sequence 20 preferably comprises one or more radiofrequency pulses 22 which momentarily produce a generally transverse magnetization for both the water and molecular species. In various exemplary embodiments of the invention pulse 22 is a 90° pulse. The typical length of pulse 22 is of the order of a hundred or a few hundreds of microseconds. According to a preferred embodiment of the present invention sequence 20 also comprise at least one crusher pulse 24 which suppresses the transverse magnetizations of the water and molecular species by dephasing it. Crusher pulse 24 can be a gradient pulse or a combination of gradient and radiofrequency pulses. The effect of pulse sequence 20 on the magnetization vector M is illustrated in FIG. 2b. Pulse 22 excites the water and the molecular species. Preferably, following the application of pulse 22, both magnetization vectors 16 and 18 lie in the transverse plane. Subsequently, the crusher pulse (pulse 24 in FIG. 2a) is applied and magnetizations 16 and 18 are suppressed. This situation is symbolically illustrated in FIG. 2b as "M∝0". In various exemplary embodiments of the invention crusher pulse 14 nulls both magnetizations.

Following a time period $t_{ZQ}$, the magnetization vectors 16 and 18 experience longitudinal relaxation and recover to their longitudinal direction such that the ratio between the two magnetizations is identical to its value in thermal equilibrium. The suppression of both magnetizations 16 and 18 following pulse 24, results in a recovery which is solely controlled by longitudinal relaxation, substantially without chemical exchange which may affect the measurement.

The size of each magnetization vector (relative to its equilibrium size) depends on the value of $t_{ZQ}$. According to a preferred embodiment of the present invention $t_{ZQ}$ is selected such that the magnetizations of the water and molecular species are lower than their magnetizations before the application of pulse sequence 20. The magnetization buildup can be from about 3% from the equilibrium value for short values of $t_{ZQ}$ (about 25 ms) to about 25% from the equilibrium value for long values of $t_{ZQ}$ (about 500 ms). Thus, the typical range for $t_{ZQ}$ in pulse sequence 20 is from about 25 ms to about 500 ms. In various exemplary embodiments of the invention the value of $t_{ZQ}$ in pulse sequence 20 is similar to, or compatible with, the value of $t_{ZQ}$ in pulse sequence 10. For example, the value of $t_{ZQ}$ for both sequence 10 and sequence 20 can be from about 100 ms to about 300 ms.

Similarly to sequence 10 above, sequence 20 can also comprise several repetitions of pulses 22 and 24. The value of the repetition factor n can selected so as to minimize the magnetizations obtained after the application of the last crusher pulse of sequence 20.

According to a preferred embodiment of the present invention sequence 20 comprises a preparation radiofrequency pulse 21 which is characterized by a pulse length of the order of the characteristic longitudinal relaxation time of the water. Such preparation pulse can improve the magnetization suppression. When the repetition factor of sequence 20 is more than 1, preparation pulse 21 is preferably applied before the first transmission of pulse 22 of sequence 20 and is not repeated.

Acquisition of magnetic resonance signals can be performed following the relaxation period. The acquisition time and pulse sequence are generally shown in FIG. 2a at 23.

The difference between sequence 10 and sequence 20 is that in sequence 10 the applied pulses are selected to excite only the water molecules, while in sequence 20 the applied pulses are selected to excite the water as well as the molecular species of interest. Such different effects can be achieved by judicious selection of the parameters of pulses 12 and 22. These parameters can be the length and/or intensity of the pulses. According to a preferred embodiment of the present invention the length of pulse 12 is longer than the length of pulse 22. Additionally or alternatively, the intensity of pulse 12 is lower than the intensity of pulse 22. It was found by the Inventors of the present invention that a longer pulse with lower intensity (referred to herein as a "soft" pulse) can exclusively excite the water molecules, whereas a shorter pulse with higher intensity (referred to herein as a "hard" pulse) can excite the water as well as the molecular species of interest. Preferred lengths for the pulses are 400 μs or more for pulse 12 and 200 μs or less for pulse 22. The power level of pulse 22 is preferably higher than the power level of pulse 12 by a factor of at least 10, and typically in the range of 10-to 20.

Figure 3:
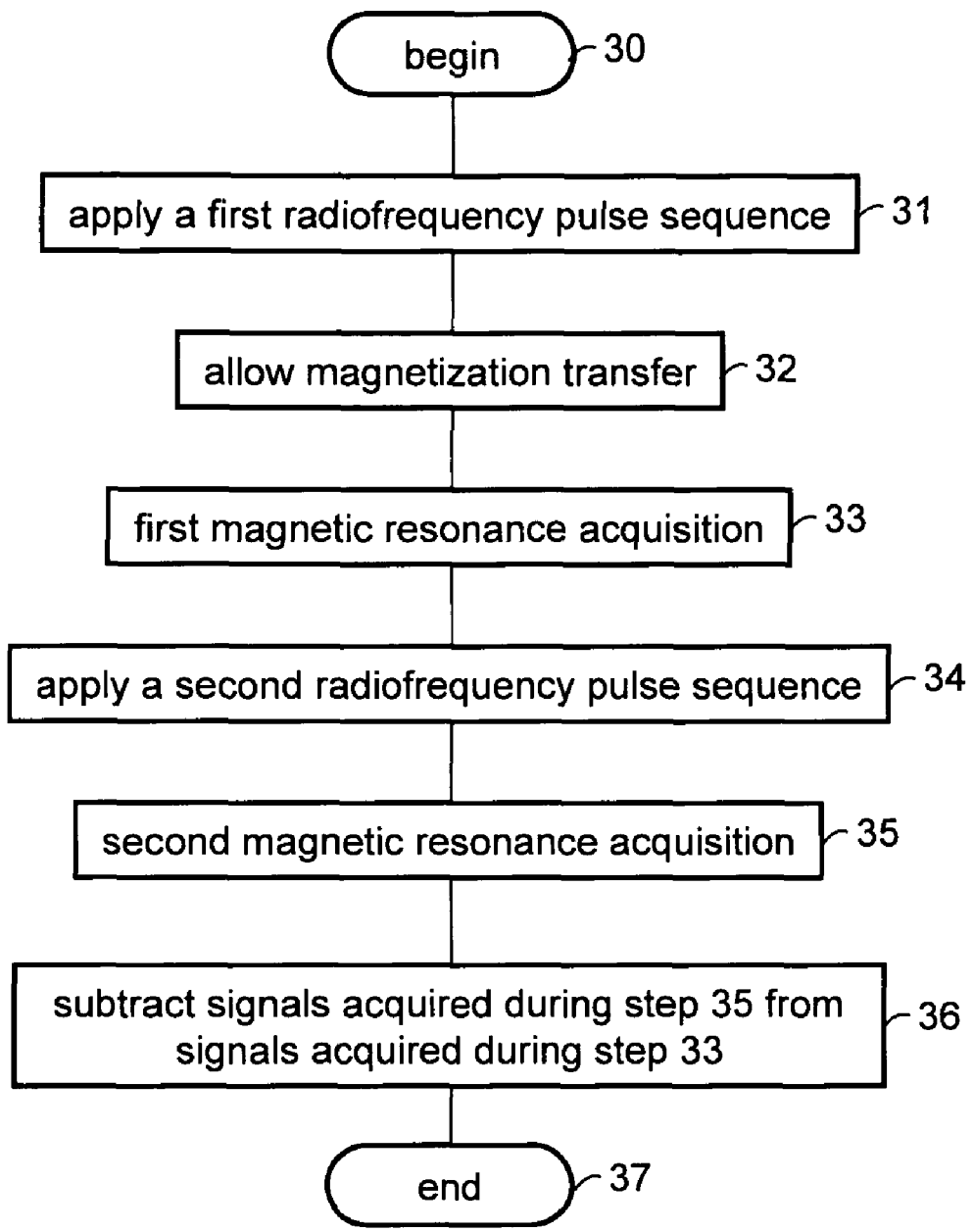
FIG. 3 is a flowchart diagram of a method suitable for analyzing and/or imaging a body, according to various exemplary embodiments of the present invention.

Reference is now made to FIG. 3 which is a flowchart diagram of a method suitable for analyzing and/or imaging a body.

It is to be understood that, unless otherwise defined, the method steps described hereinbelow can be executed either contemporaneously or sequentially in many combinations or orders of execution. Specifically, the ordering of the flowchart diagrams is not to be considered as limiting. For example, two or more method steps, appearing in the following description or in the flowchart diagrams in a particular order, can be executed in a different order (e.g., a reverse order) or substantially contemporaneously. Additionally, several method steps described below are optional and may not be executed.

The method begins at step 30 and continuous to step 31 in which a first radiofrequency pulse sequence, such as sequence 10 is applied to the body, so as to suppress magnetization for the water while preserving a generally longitudinal magnetization to the molecular species. The method continues to step 32 in which magnetization transfer is allowed to take place during a predetermined evolution period $t_{ZQ}$, such that at least a part of the magnetization of the molecular species is transferred to the water and preferably achieves pseudo-equilibrium, as described hereinabove. According to a preferred embodiment of the present invention the method continues to step 33 in which magnetic resonance signals are acquired from the body. The acquisition can be according to any magnetic resonance acquisition protocol known in the art, and it can be performed either to analyze the body and/or to obtain a magnetic resonance image thereof. The acquisition can thus be selected to produce magnetic resonance images weighted, e.g., by magnetization transfer and by longitudinal relaxation time $T_1$. The parameters of the pulse sequence can also be selected in accordance with the desired type of image. For example, when $T_1$ weighted image is desired, the value of the evolution period $t_{ZQ}$ is preferably shorter than the characteristic $T_1$ of the water.

In various exemplary embodiments of the invention the method continues to step 34 in which a second radiofrequency pulse sequence, such as sequence 20 is applied to the body, so as to suppress longitudinal and transverse magnetization for both the water and the molecular species. Following the application of the second sequence, the method allows for longitudinal relaxation to take place over a predetermined relaxation period which is preferably compatible with more preferably substantially equals the evolution period $t_{ZQ}$ of the first sequence. In various exemplary embodiments of the invention the predetermined relaxation period of the second sequence substantially equals the evolution period of the first sequence.

The method can then continue to step 35 in which magnetic resonance signals are acquired from the body, preferably according to the same magnetic resonance acquisition protocol as in step 33. Since the second pulse sequence results in longitudinal relaxation substantially without the effect of magnetization transfer, the signals acquired in step 35 are $T_1$ weighted.

The method continues to step 36 in which the signals acquired during the second acquisition (step 35) are subtracted from the signals acquired during the first acquisition (step 33). Since the signals acquired in step 35 are induced by a sequence that facilitates solely longitudinal relaxation, and the signals acquired in step 33 are induced by a sequence that facilitates longitudinal relaxation as well as magnetization transfer, the subtraction between signals is substantially eliminates contributions originating from components which do not exchange magnetization with water. Thus, in accordance with the present embodiments, regions in which there is magnetization transfer between the molecular species and the water are emphasized.

The subtraction between signals can be executed either at the level of raw data, or at the level of images. When the subtraction is at raw data level, an image can be constructed following the subtraction. When the subtraction is at the level of images, the subtraction is preferably performed pixel-by-pixel using digital pixel data of individual pixels of the image. Such operations are known to those ordinarily skilled in the art of signal processing and image processing.

The method ends at step 36.

Figure 4:
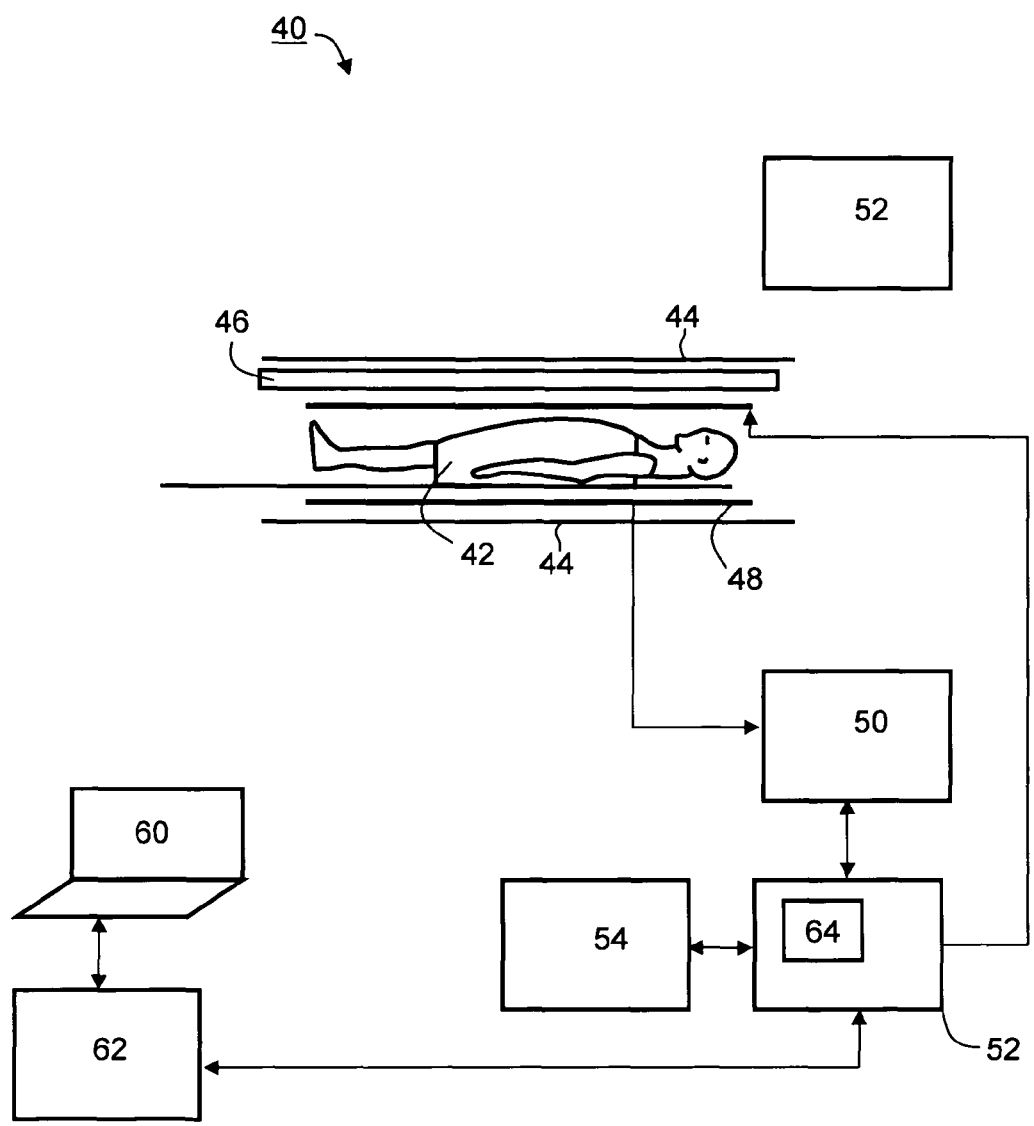
FIG. 4 is a schematic illustration of a magnetic resonance imaging system, according to various exemplary embodiments of the present invention.

Reference is now made to FIG. 4 which is a schematic illustration of a magnetic resonance imaging system 40 for imaging a body 42, according to various exemplary embodiments of the present invention. System 40 comprises a static magnet system 44 which generating a substantially homogeneous and stationary magnetic field $B_0$ in the longitudinal direction, a gradient assembly 46 which generates instantaneous magnetic field gradient pulses to form a non-uniform superimposed magnetic field, and a radiofrequency transmitter system 48 which generates and transmits radiofrequency pulses to body 42.

System 40 further comprises an acquisition system 50 which acquires magnetic resonance signal from the body, and a control system 52 which is configured for implementing the various pulse sequences (e.g., pulses 10 and 20) of the present embodiments. Control system 52 is also configured to control acquisition system 50 such that magnetic resonance signals are sequentially acquired after the magnetization transfer and after the longitudinal relaxation as further detailed above. Once the signals are acquired, control system 52 subtracts the signals of the two acquisitions as described above.

In various exemplary embodiments of the invention system 40 further comprises an image producing system 54 which produces magnetic resonance images from the signals of each acquisition and/or from the signal obtained after the subtraction. Image producing system 54 typically implements a Fourier transform so as to transform the data into an array of image data.

The operation of system 40 is preferably controlled from an operator console 60 which can include a keyboard, control panel a display, and the like. Console 60 can include or it can communicate with a data processor 62.

The gradient pulses and/or whole body pulses can be generated by a generator module 64 which is typically a part of control system 52. Generator module 64 produces data which indicates the timing, strength and shape of the radiofrequency pulses which are to be produced, and the timing of and length of the data acquisition window.

Gradient assembly 46 typically comprises $G_x$, $G_y$ and $G_z$ coils each producing the magnetic field gradients used for position encoding acquired signals. Radiofrequency transmitter system 48 is typically a resonator which is used both for transmitting the radiofrequency signals and for sensing the resulting signals radiated by the excited nuclei in body 42. The sensed magnetic resonance signals can be demodulated, filtered, digitized etc. in acquisition system 50 or control system 52.

Additional objects, advantages, and novel features of the present invention will become apparent to one ordinarily skilled in the art upon examination of the following examples, which are not intended to be limiting. Additionally, each of the various embodiments and aspects of the present invention as delineated hereinabove and as claimed in the claims section below finds experimental support in the following examples.

EXAMPLES

Reference is now made to the following examples, which together with the above descriptions, illustrate the invention in a non limiting fashion.

The technique of the present embodiments has been implemented to obtain magnetic resonance images.

Example 1

Materials and Methods

Experiments were performed on a 8.47 T WB 360 MHz Bruker micro-imager. The repetition factor was n=4. Signals acquired after longitudinal relaxation obtained using pulse sequence 20 were subtracted from signals acquired after magnetization transfer obtained using pulse sequence 10. The period $t_{ZQ}$ was varied and a magnetization transfer rate was calculated. The lengths of the 90° pulses were 460 μs for sequence 10 and 120 μs for sequence 20. Two measurements were also made with pulses of 120 μs and without subtraction.

The imaging sequence used was a multi-spin echo (TSE factor=4, TE/TR=6/3500 ms). Data matrix: 128×128, FOV of 10 mm in plane and a slice thickness of 1 mm. The sequence was tested on mice models.

Results

Figure 5A:
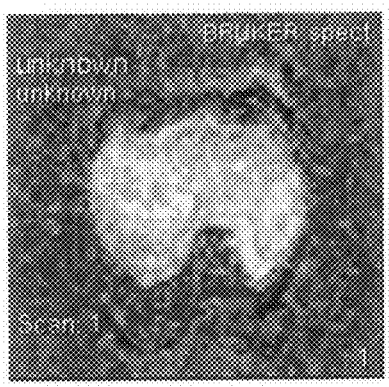
FIGS. 5a-e are magnetic resonance images of mouse models obtained in experiments performed in accordance with preferred embodiments of the present invention.
Figure 5B:
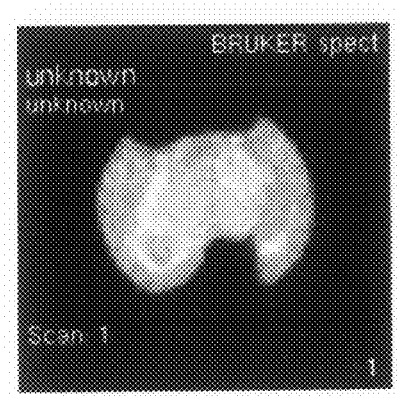
Figure 5C:
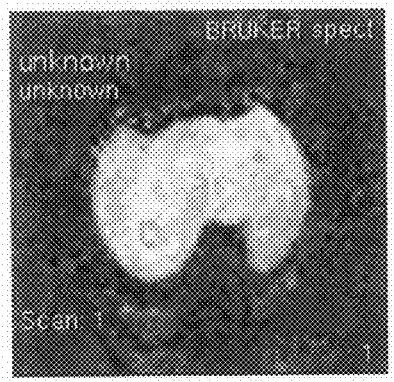

FIGS. 5*a-c* are images obtained in accordance with the present embodiment by subtracting signals acquired after pulse sequence 20 from signals acquired after pulse sequence 10. Shown in FIGS. 5*a-c* are images obtained for three values of $t_{ZQ}$: $t_{ZQ}$=5 ms (FIG. 5*a*), $t_{ZQ}$=350 ms (FIG. 5*b*) and $t_{ZQ}$=1500 ms (FIG. 5*c*).

Figure 5D:
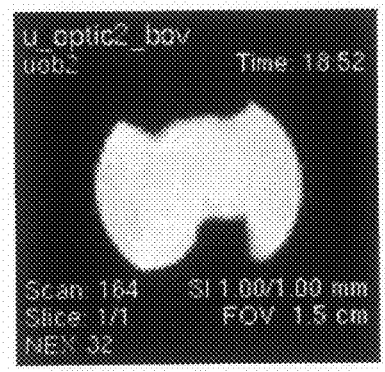
Figure 5E:
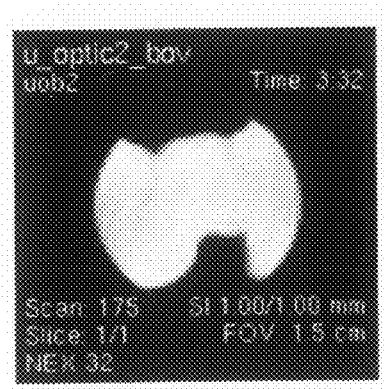

FIG. 5*d-e* are images obtained using a pulse sequence which is similar to the pulse sequence 10 but with a 90° pulse length of 120 μs with no subtraction. For the image of FIG. 5*d*, the value of $t_{ZQ}$ was 350 ms and the image of FIG. 5*e*, the value of $t_{ZQ}$ was 1500 ms.

The analysis of the images as a function of $t_{ZQ}$ was used to obtain a magnetization transfer rate of 17 s$^{-1}$.

By inspecting FIGS. 5*a-c*, two processes are demonstrated. On a time scale lower than about 350 ms, which is much shorter than the longitudinal relaxation (~2000 ms), the image intensities in FIGS. a-c are proportional to the water magnetization that results from magnetization transfer from macromolecules. Thus, the images intensities are proportional to the amount of macromolecules. For mouse brain, such macromolecule can be myelin, consistent with the anatomical identification of the emphasized regions as white matter. At a longer time scale (more than 350 ms) the image intensities are dominated by the characteristic longitudinal relaxation time of the water.

The intensities of the images in FIGS. 5*d-e* are dominated by the longitudinal relaxation for all values of $t_{ZQ}$. The difference in the contrast between FIGS. 5*a-c* and FIGS. 5*d-e* is vivid. While FIGS. 5*a-c* emphasize regions where exchange takes place, FIGS. 5*d-e* distinguish between different regions on the basis of different longitudinal relaxation rates ($T_1$ weighting).

Example 2

Materials and Methods

Experiments were performed on a 3T Philips Intera scanner. The repetition factor was n=8. The evolution period $t_{ZQ}$ was varied and a magnetization transfer rate was calculated.

The imaging sequence used was a RARE (TSE factor=15, TE/TR=80/4000 ms). Data matrix: 128×128, FOV of 230 mm in plane and a slice thickness of 5 mm. The sequence was tested on a healthy volunteer using a transmit/receive head coil. Signals acquired after non-coherent longitudinal relaxation obtained using pulse sequence 20 were subtracted from signals acquired after magnetization coherence obtained using pulse sequence 10. The pulse lengths were 700 μs for pulse sequence 10 and 200 μs for pulse sequence 20.

Results

Figure 6A:
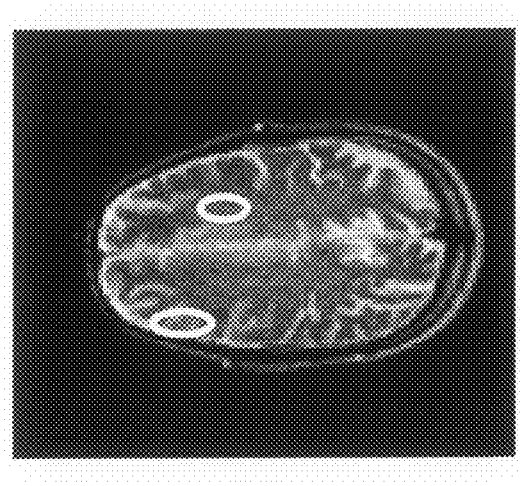
FIG. 6a is a $T_2$ weighted magnetic resonance image of an axial slice of a human brain.

FIG. 6*a* shows a $T_2$ weighted image of the axial slice on which the experiment was carried out. Two regions of interest (ROIs) on which the preliminary ROI analysis was carried out are marked with ellipses: one ROI is centered on a white matter region, and the other ROI on cortical gray matter.

Figure 6B:
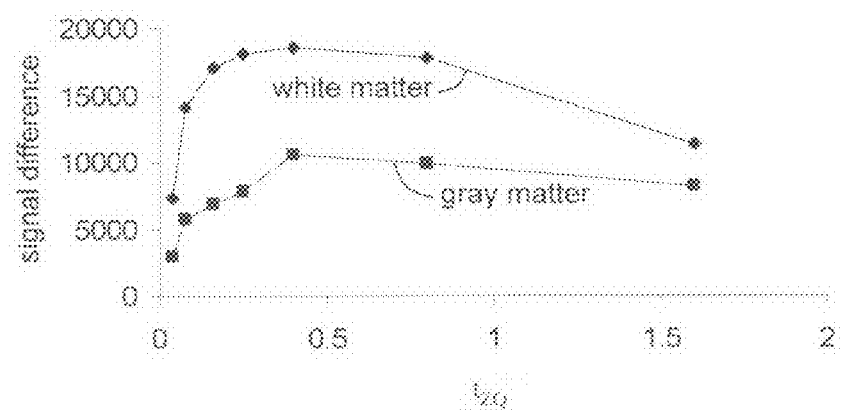

FIG. 6*b* shows magnetization exchange time analysis for the white matter and gray matter ROIs as a function of $t_{ZQ}$. As shown, the white matter ROI generates a significantly stronger contrast than the gray matter ROI, and the maximum signal difference is obtained at about $t_{ZQ}$=400 ms.

Figure 6C:
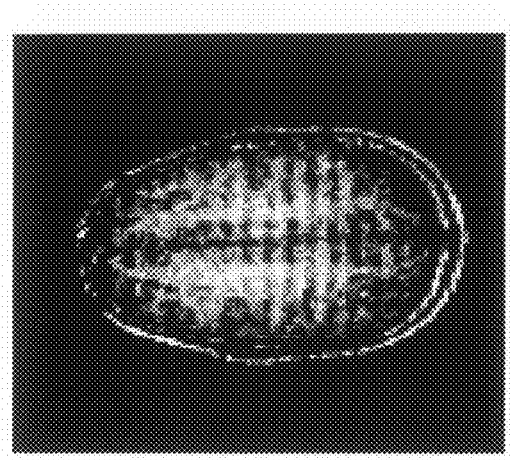
FIG. 6c is a magnetic resonance images of the human brain of FIG. 6a, as obtained in accordance with preferred embodiments of the present invention.

FIG. 6*c* is a magnetic resonance image obtained for $t_{ZQ}$=400 ms. As shown, cerebrospinal fluid in the inter-hemispheric fissure and in the sulci is not visible in the image.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A method of magnetic resonance analysis of a body having therein at least one molecular species and water, comprising: using a signal processor or a data processor for subtracting magnetic resonance signals induced by a second radiofrequency pulse sequence from magnetic resonance signals induced by a first radiofrequency pulse sequence followed by a evolution period;
   said first radiofrequency pulse sequence being selected so as to suppress magnetization for the water while preserving a generally longitudinal magnetization to the at least one molecular species, and said second radiofrequency pulse sequence being selected so as to suppress transverse and longitudinal magnetization for both the water and the at least one molecular species.

2. The method of claim 1, wherein said first radiofrequency pulse sequence is selected so as to momentarily produce a generally transverse magnetization for the water, and to dephase said generally transverse magnetization thereafter.

3. The method of claim 2, wherein each of said first and said second radiofrequency pulse sequence independently comprises at least one crusher pulse.

4. The method of claim 2, wherein each of said first and said second radiofrequency pulse sequences independently comprises at least one pulse being characterized by a pulse length of at least 100 microseconds.

5. The method of claim 4, wherein the pulse length of said at least pulse of said first radiofrequency pulse sequence is longer than the pulse length of said at least one pulse of said second radiofrequency pulse sequence.

6. The method of claim 4, wherein the intensity of said at least one pulse of said first radiofrequency pulse sequence is lower than the intensity of said at least one pulse of said second radiofrequency pulse sequence.

7. The method of claim 2, wherein each of said first and said second radiofrequency pulse sequence independently comprises at least one 90-degrees pulse.

8. The method of claim 1, wherein said second radiofrequency pulse sequence is selected so as to momentarily produce a generally transverse magnetization for the water and a generally transverse magnetization for the at least one molecular species, and to dephase said generally transverse magnetizations thereafter.

9. The method of claim 1, wherein any of said radiofrequency pulse sequences is characterized by repetition factor selected so as to minimize said magnetization of the water.

10. The method of claim 1, wherein said second radiofrequency pulse sequence is characterized by repetition factor selected so as to minimize said magnetizations of the water and said at least one molecular species.

11. The method of claim 1, wherein said second radiofrequency pulse sequence comprises a preparation radiofrequency pulse characterized by a pulse length of the order of the characteristic longitudinal relaxation time of the water.

12. The method of claim 1, further comprising producing at least one magnetic resonance image of the body.

13. The method of claim 1, wherein said subtraction comprises producing a first digital magnetic resonance image of the body from said magnetic resonance signals induced by said first radiofrequency pulse sequence, producing a second digital magnetic resonance image of the body from said magnetic resonance signals induced by said second radiofrequency pulse sequence, and digitally subtracting said second image from said first image.

14. The method of claim 1, wherein at least one molecular species comprises at least one macromolecule.

15. The method of claim 14, wherein said macromolecule is selected from the group consisting of a protein, a glycoprotein, a proteolipid, a lipid, a carbohydrate, a nucleic acid and a complex of macromolecules which comprises at least two components selected from the group consisting of a protein, a glycoprotein, a proteolipid, a lipid, a carbohydrate, a nucleic acid.

16. The method of claim 1, wherein the body is a body of a mammal or a part thereof.

17. The method of claim 16, wherein said part is an organ selected from the group consisting of a brain, a heart, a kidney, a gland, a testicle, an ovary, an eye, a liver, a pancreas and a spleen.

18. The method of claim 1, wherein the body comprises a tissue.

19. The method of claim 18, wherein said tissue is selected from the group consisting of a connective tissue, a tendon, a portion of a skin, a bone, a muscle, a cartilage, a blood vessel, a ligament, a nerve and a lymph node.

20. A magnetic resonance imaging system for imaging a body having therein at least one molecular species and water, the system comprising a control system configured for: implementing a first radiofrequency pulse sequence followed by a evolution period, acquiring magnetic resonance signals from the body to obtain a first magnetic resonance acquisition, implementing a second radiofrequency pulse sequence, acquiring magnetic resonance signals from the body to obtain a second magnetic resonance acquisition, and subtracting signals of said second magnetic resonance acquisition from signals of said first magnetic resonance acquisition;
   wherein said first radiofrequency pulse sequence is selected so as to suppress magnetization for the water while preserving a generally longitudinal magnetization for the at least one molecular species; and
   wherein said second radiofrequency pulse sequence is selected so as to suppress transverse and longitudinal magnetization for both the water and the at least one molecular species.

21. The system of claim 20, further comprising an image producing system for producing at least one magnetic resonance image of the body.

22. The system of claim 20, further comprising an image producing system, wherein said control system and said image producing system are designed and configured to produce a first digital magnetic resonance image of the body from said first magnetic resonance acquisition and a second digital magnetic resonance image of the body from said second magnetic resonance acquisition, and to digitally subtract said second image from said first image.

23. A method of magnetic resonance analysis of a body having therein at least one molecular species and water, comprising:
   using a radiofrequency transmitter system for applying a radiofrequency pulse sequence which comprises at least one pulse characterized by a pulse length of at least 250 microseconds, so as to suppress magnetization for the water while preserving a generally longitudinal magnetization to the at least one molecular species;
   during a predetermined evolution period, allowing magnetization transfer from the at least one molecular species and the water; and using acquisition system for acquiring magnetic resonance signals from the body, thereby analyzing the at least one molecular species.

24. The method of claim 23, wherein said radiofrequency pulse sequence is selected so as to momentarily produce a generally transverse magnetization for the water, and to dephase said generally transverse magnetization thereafter.

25. The method of claim 24, wherein said radiofrequency pulse comprises at least one crusher pulse.

26. The method of claim 23, wherein said at least one pulse comprises at least one 90-degrees pulse.

27. Apparatus for producing a radiofrequency pulse sequence for magnetic resonance analysis, the apparatus comprising a pulse generator configured for generating a radiofrequency pulse sequence which comprises at least one pulse characterized by a pulse length of at least 250 microseconds, the radiofrequency pulse sequence being selected so as to suppress magnetization for water while preserving a generally longitudinal magnetization to at least one molecular species present in said water and being capable of transferring said generally longitudinal magnetization thereto.

28. A magnetic resonance imaging system for analysis a body having therein at least one molecular species and water, comprising:

a static magnet system for generating a substantially homogeneous and stationary magnetic field in a longitudinal direction;

a gradient assembly for instantaneously generating magnetic field gradient pulses to form a non-uniform superimposed magnetic field;

a radiofrequency transmitter system for generating and transmitting radiofrequency pulses to the body;

an acquisition system for acquiring magnetic resonance signal from the body; and a control system configured to implement a radiofrequency pulse sequence followed by a predetermined evolution period, said radiofrequency pulse sequence being generated by said gradient assembly and/or said radiofrequency transmitter system such that a magnetization for the water is suppressed and a magnetization for the at least one molecular species is preserved in a generally longitudinal orientation, wherein said radiofrequency pulse sequence comprises at least one pulse characterized by a pulse length of at least 250 microseconds.

* * * * *